(12) United States Patent
Maerkle

(10) Patent No.: US 10,153,605 B2
(45) Date of Patent: Dec. 11, 2018

(54) CONTACTING PART FOR A DRIVE MODULE, DRIVE MODULE, AND METHOD FOR PRODUCING A CONTACTING PART

(71) Applicant: Robert Bosch GmbH, Stuttgart (DE)

(72) Inventor: Jens Maerkle, Buehl (DE)

(73) Assignee: Robert Bosch GmbH, Stuttgart (DE)

( * ) Notice: Subject to any disclaimer, the term of this patent is extended or adjusted under 35 U.S.C. 154(b) by 361 days.

(21) Appl. No.: 14/891,552

(22) PCT Filed: Mar. 11, 2014

(86) PCT No.: PCT/EP2014/054653
§ 371 (c)(1),
(2) Date: Nov. 16, 2015

(87) PCT Pub. No.: WO2014/183899
PCT Pub. Date: Nov. 20, 2014

(65) Prior Publication Data
US 2016/0087387 A1    Mar. 24, 2016

(30) Foreign Application Priority Data

May 17, 2013    (DE) .................. 10 2013 209 233

(51) Int. Cl.
| | | |
|---|---|---|
| *H01R 39/32* | (2006.01) | |
| *H01R 39/38* | (2006.01) | |
| *H02K 5/14* | (2006.01) | |
| *H02K 11/026* | (2016.01) | |
| *H02K 5/22* | (2006.01) | |
| *H02K 11/38* | (2016.01) | |
| *H05K 3/10* | (2006.01) | |
| *H05K 3/30* | (2006.01) | |

(52) U.S. Cl.
CPC .............. *H01R 39/383* (2013.01); *H02K 5/14* (2013.01); *H02K 5/225* (2013.01); *H02K 11/026* (2013.01);
(Continued)

(58) Field of Classification Search
CPC .... H02K 5/225; H02K 11/024; H02K 11/026; H02K 7/1166
(Continued)

(56) References Cited

U.S. PATENT DOCUMENTS

| 8,129,879 B2 * | 3/2012 | Uchimura ............. H02K 5/148 310/239 |
| 2002/0121151 A1 * | 9/2002 | Kraus .................... H02K 5/148 74/425 |

(Continued)

FOREIGN PATENT DOCUMENTS

| DE | 19858232 | 3/2000 |
| DE | 102004059912 A1 | 6/2006 |

(Continued)

OTHER PUBLICATIONS

International Search Report for Application No. PCT/EP2014/054653 dated Mar. 20, 2015 (English Translation, 3 pages).

*Primary Examiner* — Thanh Lam
(74) *Attorney, Agent, or Firm* — Michael Best & Friedrich LLP

(57) ABSTRACT

The invention relates to a contacting part (5) for a drive module (1), comprising: a main body for providing contacting of a brush-commutated drive motor (2) by means of brushes; at least one supply line (62), in particular a punched-grid line (62), for electrically contacting the drive motor (2); a circuit surface (57), to which a conducting track is directly applied by means of an MID technique; and at least one component (59), in particular a surface-mounted device (59), which is electrically connected to the conducting track (58).

20 Claims, 6 Drawing Sheets

(52) U.S. Cl.
CPC ............. *H02K 11/38* (2016.01); *H05K 3/108* (2013.01); *H05K 3/303* (2013.01); *H02K 2203/03* (2013.01)

(58) Field of Classification Search
USPC .................... 310/71, 43, 98–99, 234, 249
See application file for complete search history.

(56) References Cited

U.S. PATENT DOCUMENTS

| | | | | |
|---|---|---|---|---|
| 2003/0008746 A1* | 1/2003 | Meier | ................. | H02K 11/215 475/149 |
| 2003/0015059 A1* | 1/2003 | Schwital | .............. | H02K 7/1166 74/606 A |
| 2005/0189829 A1* | 9/2005 | Thomson | ............. | H02K 11/024 310/71 |
| 2005/0285463 A1 | 12/2005 | Hockaday et al. | | |
| 2007/0120431 A1* | 5/2007 | Kokubu | ................. | H02K 5/148 310/75 R |
| 2009/0251030 A1 | 10/2009 | Fujimoto et al. | | |

FOREIGN PATENT DOCUMENTS

| | | |
|---|---|---|
| DE | 102006055159 | 5/2008 |
| EP | 1261108 | 11/2002 |
| EP | 1351368 | 10/2003 |
| JP | 2010173466 | 8/2010 |
| WO | 0159915 | 8/2001 |
| WO | 0180407 | 10/2001 |

* cited by examiner

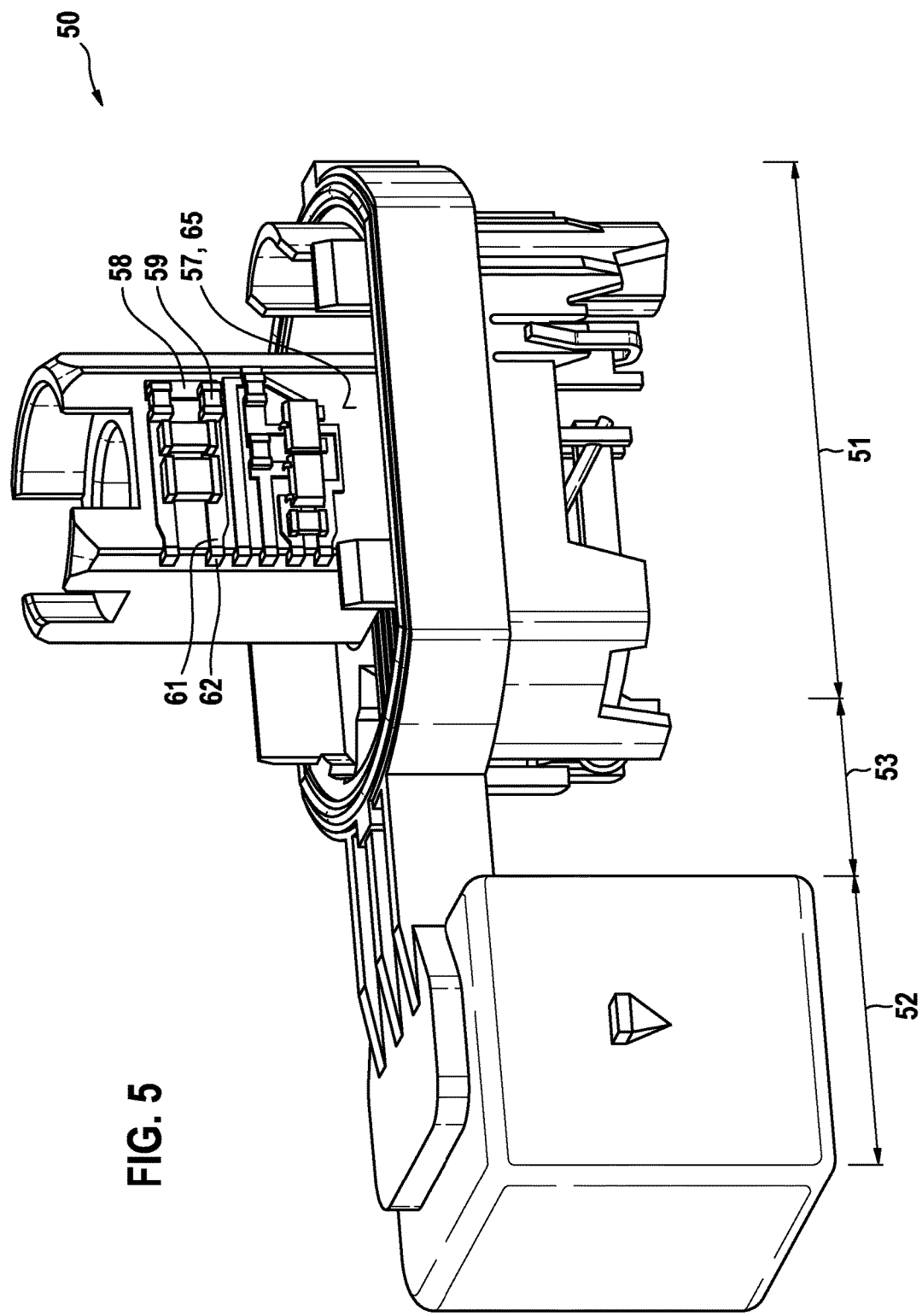

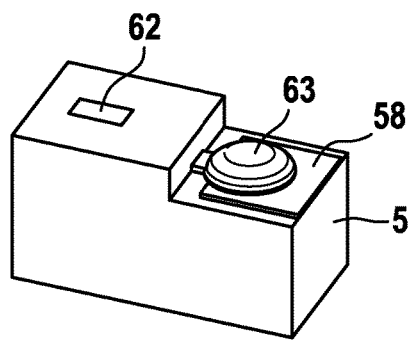 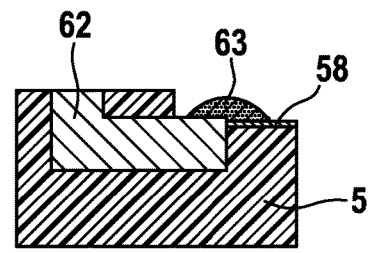
FIG. 6a          FIG. 6b
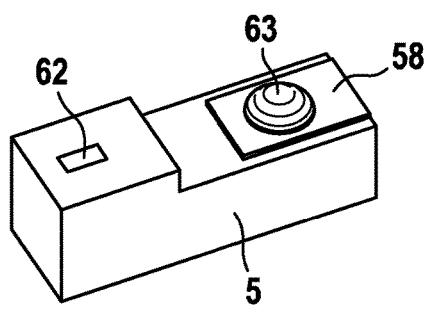 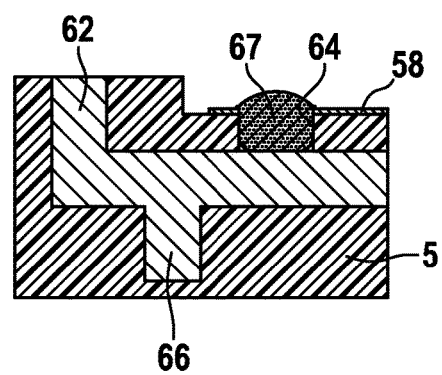
FIG. 7a          FIG. 7b
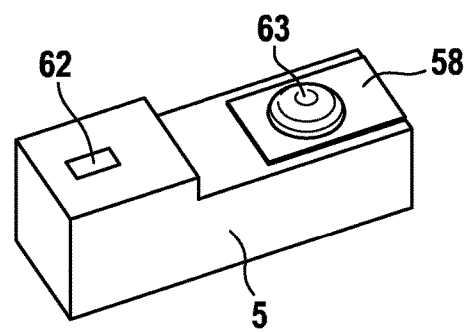 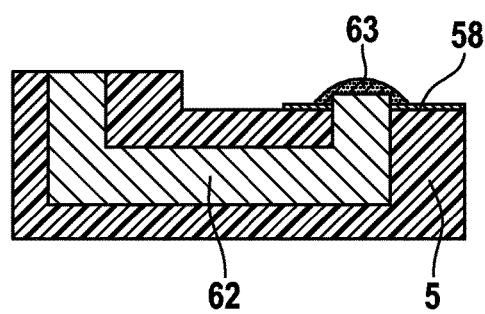
FIG. 8a          FIG. 8b

CONTACTING PART FOR A DRIVE MODULE, DRIVE MODULE, AND METHOD FOR PRODUCING A CONTACTING PART

BACKGROUND OF THE INVENTION

The present invention relates to drive modules, in particular drive modules with electric motors. The invention furthermore relates in particular to the arrangement of EMC (Electromagnetic Compatibility) components and/or sensors for sensing the position of the rotor in electric machines for drive modules.

Electric motors in drive modules, such as, for example, power window drive modules in motor vehicles, can be provided as brush-commutated DC motors. Electric motors of this type are provided with brush supports which hold brushes for the electric commutation of the electric motor. The brushes are customarily electrically connected to an external plug connector via a leadframe.

In order to reduce EMC interfering signals on the supply lines, EMC components and/or sensors for sensing the position of a rotor are electrically connected to leadframe lines of the leadframe. The EMC components and/or sensors can be provided as wired components which are connected to the leadframe lines by a welding or soldering process.

In order to save construction space, the wired components can be replaced by SMD (Surface Mount Device) components which are either directly connected to the leadframe lines or are placed into a suitable printed circuit board which is electrically connected to the leadframe lines. However, the electric contacting of SMD components frequently turns out to be complicated in practice.

Electric machines for drive modules are generally provided with a pole pot housing and a contacting part which is placed onto the end side thereof and provides brush supports for receiving brushes via which the rotor of the electric machine can be electrically contacted. The contacting part furthermore has leadframe lines which end at a plug connector, wherein a circuit consisting of SMD components and/or one or more sensors for detecting the position of a rotor is arranged between the plug connector and the brushes. The arrangement of the components increases the construction space required and therefore influences the overall size of a drive module in which the brush support element is inserted.

It is the object of the present invention to provide a contacting part for a drive module, which contacting part serves for receiving brush supports and for electric contacting thereof. Furthermore, the contacting part is intended to be provided in a space-saving manner with electric components, in particular EMC components and/or one or more sensor components.

SUMMARY OF THE INVENTION

This object is achieved by a contacting part for a drive module and by the electric machine and the drive module according to the invention.

According to a first aspect, a contacting part for a drive module is provided, comprising:

an electrically non-conductive basic body for providing contacting of a brush-commutated drive motor via brushes;

at least one supply line, in particular a leadframe line, for electrically contacting the drive motor;

a circuit surface of the basic body, on which a strip conductor is directly applied by means of an MID (Molded Interconnect Device) technique; and at least one electric component, in particular an SMD component, which is electrically connected to the strip conductor.

One concept of the above contacting part consists in providing the basic body of the contacting part with a circuit surface onto which a strip conductor is directly applied. In other words, the strip conductor is directly applied onto the non-conductive material, in particular the plastics material, of the basic body of the contacting part. It is thereby possible to dispense with both wired components and with printed circuit boards for the connection of SMD components and therefore to considerably reduce the construction space required for the provision of the components.

Furthermore, it is possible to use conventional SMD components for application onto the strip conductor applied on the surface of the contacting part.

Moreover, the contacting part can be provided with simplified geometry since holders for components or printed circuit boards can be omitted. The contacting part is frequently produced as an injection molded part, as a result of which the outlay for the production can be considerably reduced and, furthermore, plastics material can be saved.

In addition, because of the shorter connections of EMC components, an improved EMC behavior can be achieved.

Furthermore, the at least one supply line can run at least in sections in a direction of extent, wherein the circuit surface is arranged transversely with respect to the direction of extent.

Alternatively, the at least one supply line can run at least in sections in a direction of extent, wherein the circuit surface is arranged parallel to the direction of extent, and wherein, for contacting the at least one supply line, the strip conductor is guided onto an adjacent supply line surface which is arranged transversely with respect to the direction of extent.

According to an embodiment, it can be provided that the component is connected to the strip conductor and/or the strip conductor is connected to the at least one supply line by a conductive material, in particular a conductive adhesive or a solder material, being applied between the contact of the component and the strip conductor or between the at least one supply line and the strip conductor.

It can be provided that a portion of the supply line is accessible via an opening close to one end of the strip conductor to be contacted, wherein a portion of the supply line penetrates the strip conductor to be contacted, or wherein a portion of the supply line is guided on a surface of the contacting part and the strip conductor is adjacent to the portion of the supply line.

According to a further aspect, a drive module is provided which comprises a drive motor and the above contacting part which is connected to the drive motor in order to provide contacting of the drive motor via the supply lines.

Furthermore, the drive module can be inserted into a housing of the drive motor.

A transmission case can be arranged on a side of the contacting part that is situated opposite the drive motor, wherein the circuit surface projects into the transmission case.

According to a further aspect, a method for producing a contacting part for a drive module is provided, the method comprising the following steps:

providing a non-conductive basic body, in particular made from a plastics material, with at least one at least partially embedded supply line for providing contacting of a brush-commutated drive motor;

applying a strip conductor directly onto a circuit surface of the basic body by means of an MID technique; and electrically contacting at least one electric component, in particular an SMD component, via the strip conductor.

Furthermore, it can be provided that the electric contacting of the electric component is undertaken with the aid of a curing conductive material, in particular a conductive adhesive.

It can be provided that the electric component is electrically contacted with the aid of a curing conductive material, in particular a conductive adhesive.

Furthermore, the strip conductor can be applied onto the circuit surface by means of one of the following methods:

printing with a film made from a conductive material using a hot embossing die which depicts the structures of the strip conductor as embossed surfaces such that that region of the film which is acted upon by the hot embossing die fuses with the material of the basic body and remains adhering to the basic body when the film is peeled off, while the remaining region of the film is detached from the circuit surface;

spraying the circuit surface through a patterning mask with conductive metal particles which are formed so as to adhere such that the structure of the strip conductor is formed on the circuit surface in a manner corresponding to the patterning mask; and inscribing the circuit surface with the aid of laser direct patterning in accordance with the structure of the strip conductor such that the material of the basic body is activated in the region of the strip conductor to be applied, wherein the strip conductor is produced by electrodeposition metallization of the activated region.

BRIEF DESCRIPTION OF THE DRAWINGS

Preferred embodiments of the present invention are explained in more detail below with reference to the attached drawings, in which:

FIG. 5 shows an illustration of a further contacting part with applied components;

FIGS. 6a and 6b show a perspective and sectional illustration of a manner of contacting between a leadframe line and a strip conductor on the circuit surface;

FIGS. 7a and 7b show a perspective and sectional illustration of a further manner of contacting between a leadframe line and a strip conductor on the circuit surface; and FIGS. 8a and 8b show a perspective and sectional illustration of a further manner of contacting between a leadframe line and a strip conductor on the circuit surface.

DETAILED DESCRIPTION

Figure 1:
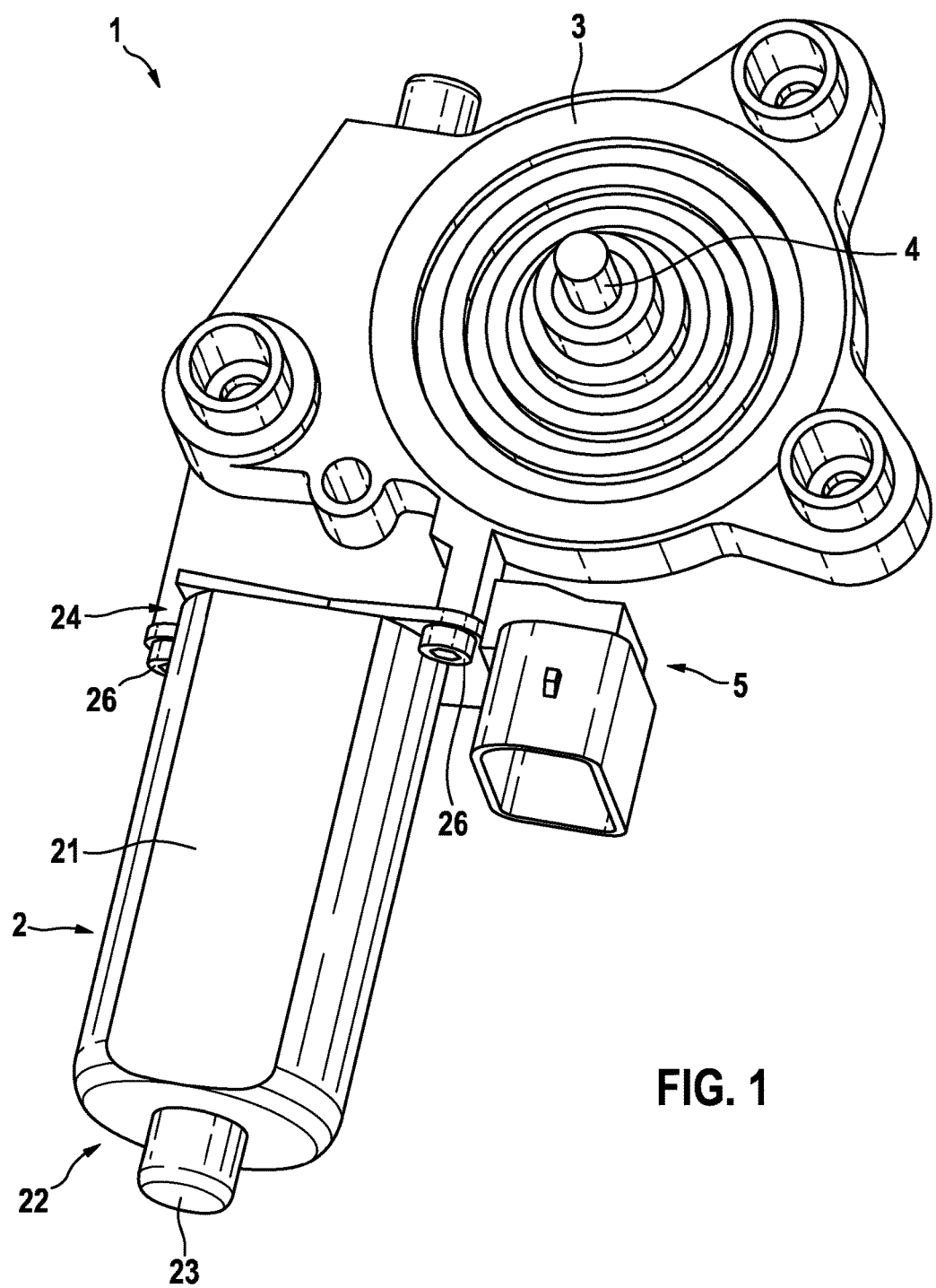
FIG. 1 shows an illustration of a drive module with a drive motor and a transmission case, which are connected to each other via a contacting part.

FIG. 1 shows a perspective illustration of a drive module 1 in the form of a power window module for use in motor vehicles with electric power windows. The drive module 1 has a drive motor 2 which is arranged on a transmission case 3. An output shaft 4 for driving a mechanism, for example for raising or lowering a window in an electric power window system of a motor vehicle, projects out of the transmission case 3. A contacting part 5 is arranged between the transmission case 3 and the drive motor 2, the contacting part mechanically connecting the drive motor 2 and the transmission case 3 to each other.

The drive motor 2 is accommodated in a stator 21 which, at a first end 22, provides a bearing receptacle 23 for the mounting of a motor shaft (not illustrated). The contacting part 5 is arranged at an end 24 of the stator 21 which is situated opposite the first end 22.

The drive motor 2 is designed in such a manner that a commutator arranged on the motor shaft projects into the contacting part 5 and is contacted there by brushes (not shown) held in a brush support. The motor shaft penetrates the contacting part 5 and projects into the transmission case 3 where said motor shaft can be connected, for example, to a worm gear in order to engage in a corresponding transmission arranged in the transmission case 3.

Figure 2:
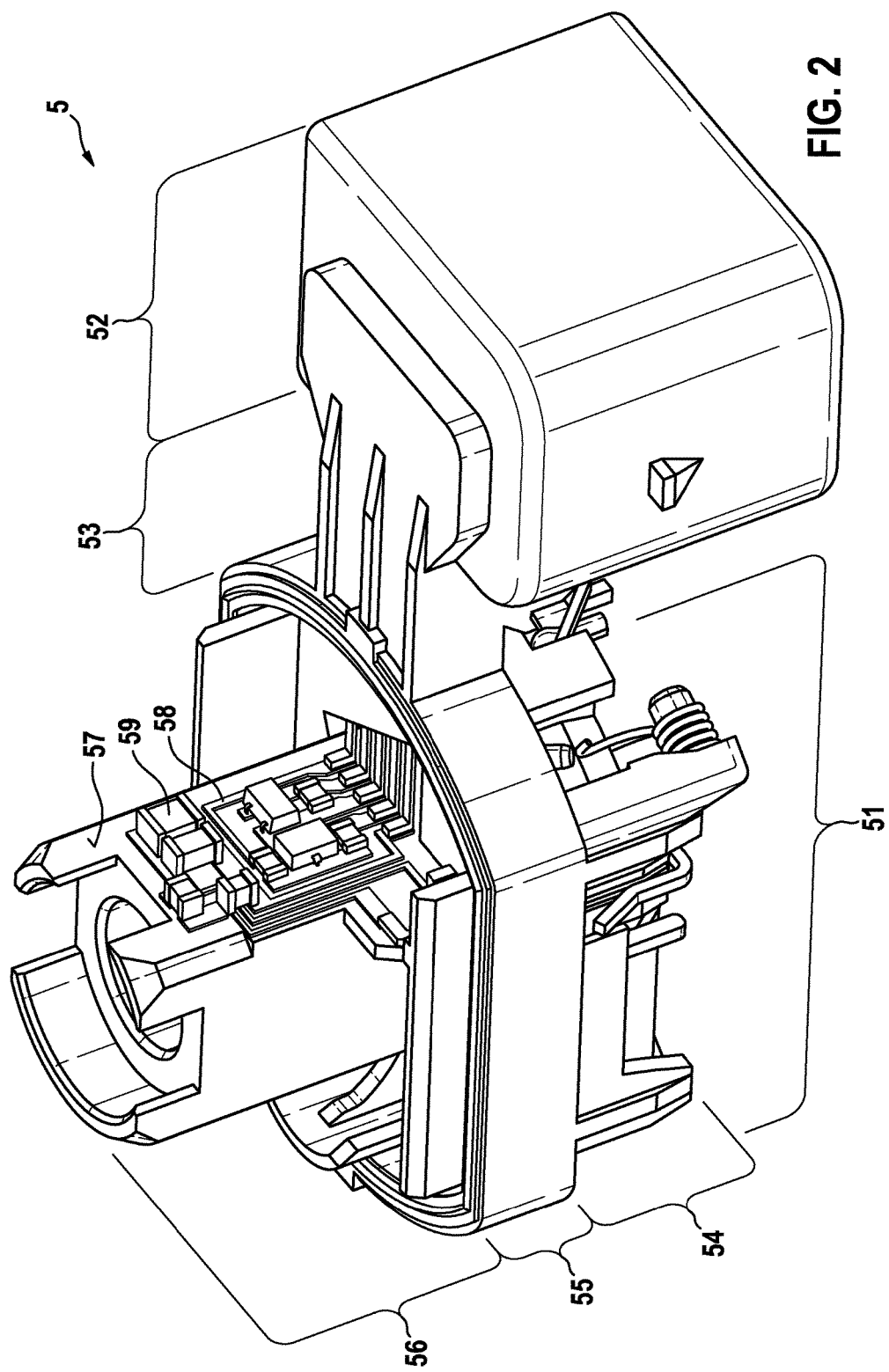
FIG. 2 shows an illustration of a contacting part with applied components.

The contacting part 5 is illustrated separately in FIG. 2. The contacting part 5 has a basic body which is preferably manufactured as a single piece from a plastics material as an injection molded component.

The basic body has a drive module portion 51 and a connector portion 52 which are connected to each other via a connection portion 53. The contacting part 5 is preferably produced as a single piece from an electrically non-conductive material, for example a plastics material, for example in an injection molding process, and serves to ensure contacting of the brushes in the drive module portion 51 via the connector of the connector portion 52.

The connector of the connector portion 52 contains protruding contact pins which can be contacted via a suitable plug connector. The contact pins are formed by the ends of leadframe lines 62 of a leadframe, which leadframe lines are in particular embedded in the material of the contacting part 5 in the connection portion 53. The leadframe lines 62 of the leadframe serve as supply lines for the drive motor 2.

The drive module portion 51 has a first holding portion 54 with holding structures which are inserted into the second end 24 of the stator 21 such that the contacting part 5 sits fixedly on the stator 21 of the drive motor 2. The contacting part 5 and the stator 21 can be connected to each other by connection elements 26, such as, for example, screws. In the first holding portion 54 of the contacting part 5, the brushes are arranged in corresponding brush supports in order electrically to contact the commutator located on the rotor shaft of the drive motor 2.

The first holding portion 54 is adjoined by a brush support base 55 of the basic body of the contacting part 5. On that side of the brush support base 55 which is situated opposite the first holding portion 54, a second holding portion 56 with corresponding holding structures is provided, the holding structures, in the fitted state, projecting into the transmission case 3 and thereby connecting the contacting part 5 to the transmission case 3.

The second holding portion 56 of the basic body has a circuit surface 57 which can be oriented in particular parallel to the axis of the motor shaft and in the direction of the connection portion 53. Alternatively, the circuit surface 57 can also be provided on other surfaces, such as, for example, on the first holding portion or on the brush support base 55.

On the circuit surface 57, a strip conductor 58 is applied directly onto the surface of the material of the basic body of the contacting part 5 with the aid of a suitable technique. The strip conductor 58 can be formed, for example, from copper, silver or another conductive material. The strip conductor 58 can be applied onto the material of the contacting part 5 with the aid of various methods.

SMD components 59 are applied onto the strip conductor 58 by means of a suitable method, for example with the aid of a conductive adhesive or by soldering, and therefore the SMD components 59 are held reliably on the strip conductor 58 and electrically contact the latter. The components 59 can comprise EMC components, such as, for example, inductors or capacitors, and, furthermore, have one or more sensor components, such as, for example, a Hall sensor, which is arranged on the circuit surface 57 in such a manner that it is situated opposite a ring magnet (not shown) on the motor shaft (not shown) in a direction perpendicular to the axial direction of the motor shaft. The strip conductor 58 is provided on the circuit surface 57 in the form of an MID (Molded Interconnect Device).

In a first method for the application of a strip conductor, the circuit surface 57 can be printed with a film made from an electrically conductive material, for example a copper film, specifically using a hot embossing die which reproduces the structures of the strip conductor 58 as heated embossed surfaces such that those regions of the film which are acted upon by the hot embossing die fuse with the plastics material of the circuit surface 57 and remain adhering to the plastics material when the film is peeled off, while the remaining regions of the metal film are not connected to the circuit surface 57 and are detached therefrom.

In a further method, the circuit surface 57 can be sprayed via a mask with conductive metal particles which are designed so as to adhere in a suitable manner. For example, a spray of silver particles can be sprayed onto the circuit surface 57 through the patterning mask, wherein the metal particles can be connected to the material of the circuit surface 57 by means of a suitable adhesive, a temperature or sufficiently high impact energy. Alternatively or additionally, solvent or the like can also be added to the spray in order to connect the metal particles permanently to the material of the contacting part 5.

With the aid of a third method, the circuit surface 57 can be inscribed in accordance with the structures of the strip conductors by means of laser direct patterning in such a manner that the material, in particular the plastics material, of the contacting part 5 is activated in order then to be able to be metalized by electrodeposition. This process is also referred to as electrochemical plating.

Figure 3:
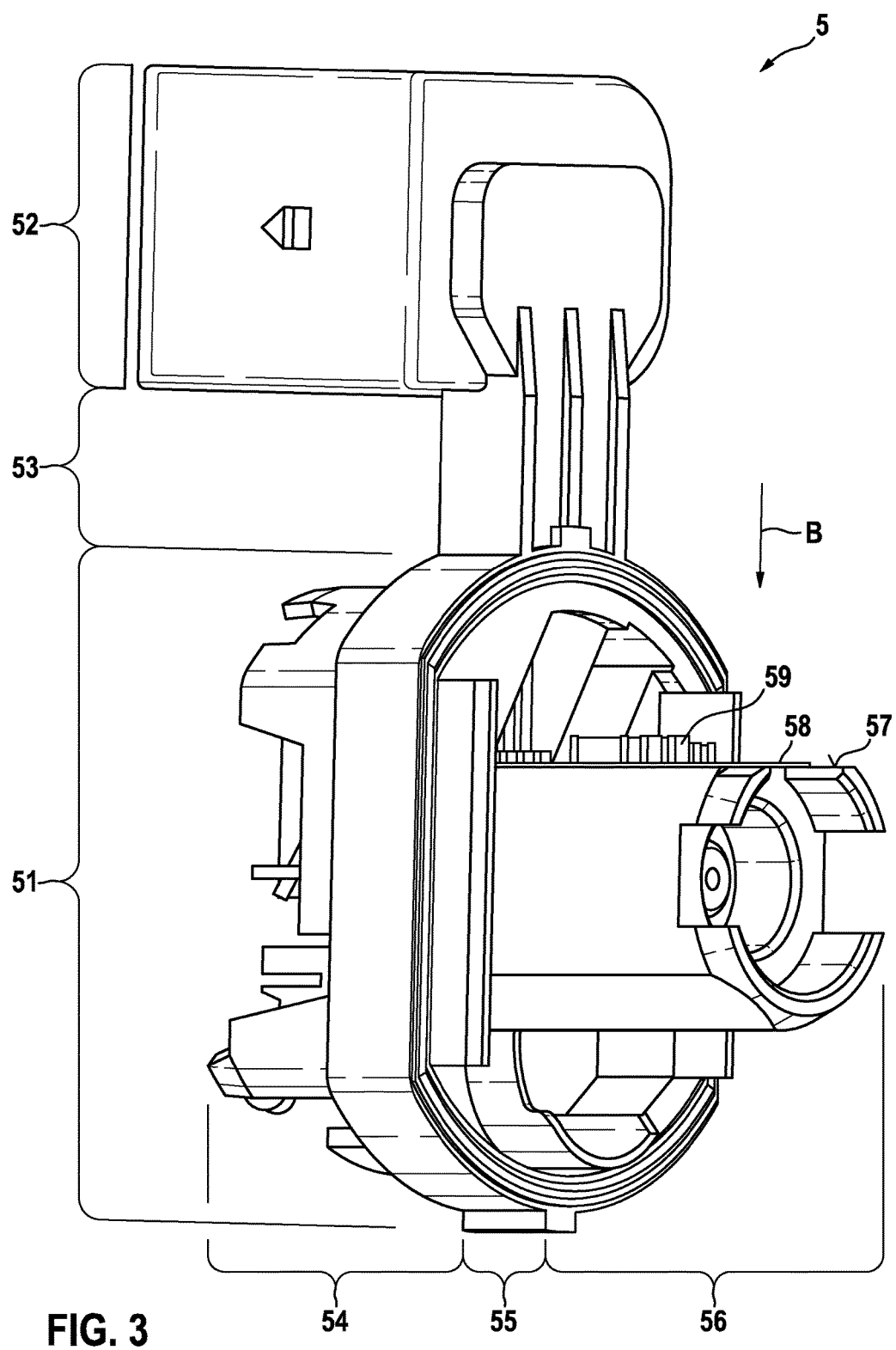
FIG. 3 shows an illustration of the contacting part from a further viewing direction to illustrate the assembly direction for the components.

FIG. 3 shows a further perspective illustration of the contacting part 5, to be precise in a direction of observation parallel to the extent of the circuit surface 57. The assembly direction B is seen as a direction perpendicular to the circuit surface 57. In the direction of the assembly direction B, the SMD components 59 are applied onto the strip conductor 58 and are subsequently fixed or soldered on using the conductive adhesive.

Figure 4:
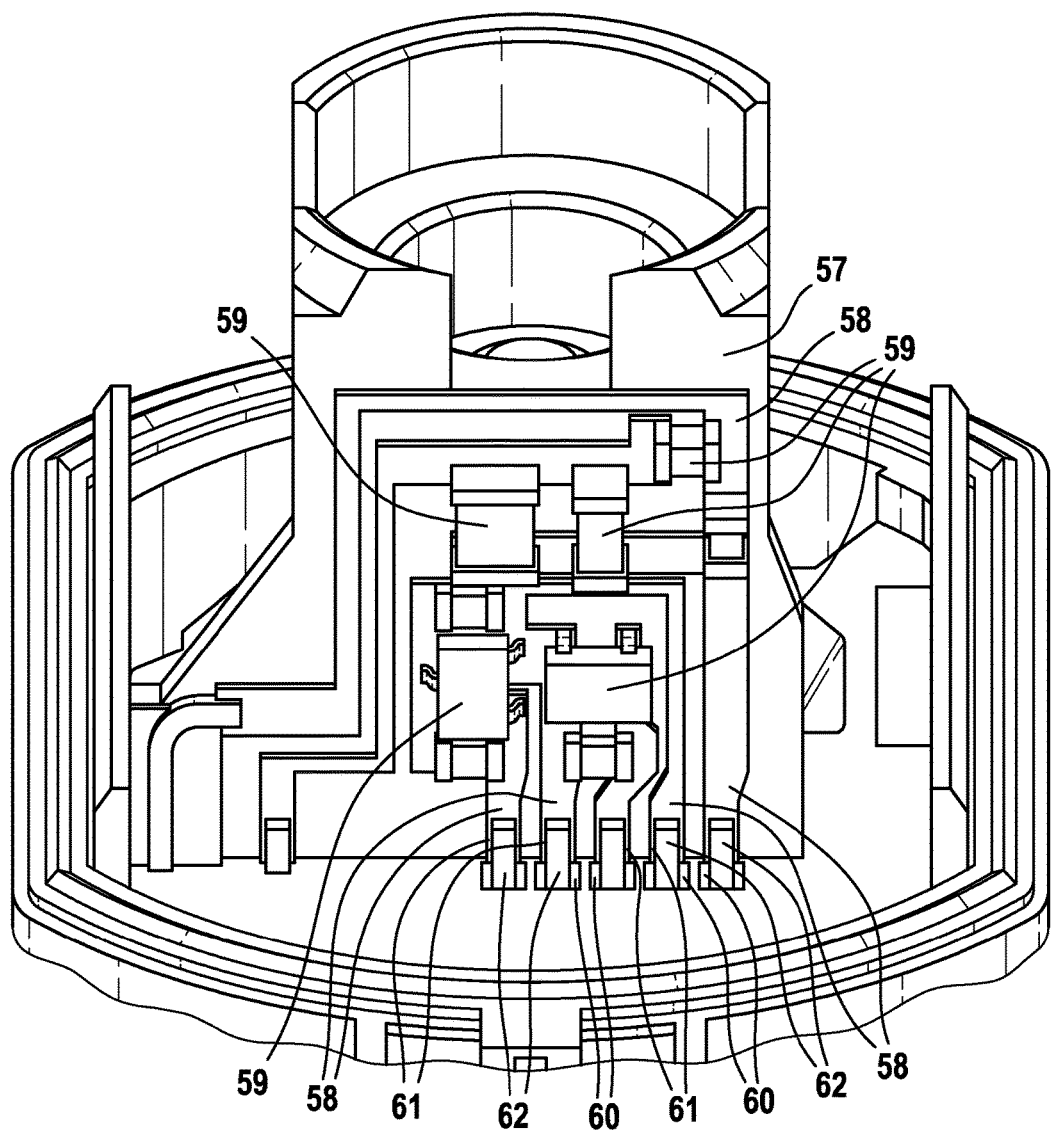
FIG. 4 shows a more detailed illustration of the circuit surface and the contacting of the leadframe lines.

FIG. 4 shows a top view of the circuit surface 57. The circuit surface 57 is adjoined by the connection portion 53, into which leadframe lines 62 as supply lines to the drive motor 2 are embedded. The circuit surface 57 protrudes substantially perpendicularly or transversely with respect to the direction of extent of the leadframe lines 62. At the position at which the circuit surface 57 sits on the brush support base 55, openings 60 are provided in the material of the contacting part 5 in order to expose the leadframe lines 62 there. The strip conductor 58 is guided to the openings 60. The circuit formed by the SMD components 59 is now contacted by the leadframe lines 62 through the openings 60.

As illustrated in FIG. 4, the strip conductor 58 is provided with ends 61 facing the openings 60. Contacting of the leadframe lines 62 by the ends 61 of the strip conductor 58 can be undertaken in a working step of the conductive adhesive bonding of the components 59 on the strip conductor 58. For this purpose, a spot of conductive adhesive has to be introduced into the openings 60 such that the spot of adhesive extends from the leadframe lines 62 as far as the ends 61 of the strip conductor 58 and thereby produces electric contacting. The spot of adhesive is then located in the opening 60, contacts the exposed portion of the leadframe line 62 concerned and is of a sufficient size in order likewise to enter into electric contact with the end 61 of the strip conductor 58.

By means of the provision of the SMD components 59 on the circuit surface 57, a construction space for wired components or for a printed circuit board, such as, for example, an interference suppression board, can be saved. The low overall height of the SMD components 59 means that the provision of additional construction space for introducing the components 59 is generally not necessary, and therefore the entire drive module 1 can be constructed in a space-saving manner. In addition, improved electric properties should be anticipated since the components 59 can be connected with a shorter connection to the leadframe lines 62.

A further contacting part 50 is illustrated separately in FIG. 5. As in the above embodiment, the contacting part 50 has a drive module portion 51 and a connector portion 52, which are connected to each other via a connection portion 53. However, in contrast, rather than being arranged transversely with respect to the direction of extent of the leadframe lines 62, the circuit surface 57 is arranged parallel thereto, wherein the strip conductor 58 extends to a supply line surface 65 which, as part of the circuit surface, runs transversely with respect to the direction of extent of the leadframe lines 62 such that contacting with the leadframe lines 62 can be undertaken in the manner described above.

FIGS. 6a-6b illustrate a perspective and cross-sectional illustration through a further configuration of the connection region between one of the leadframe lines 62 and the strip conductor 58. It is illustrated in the embodiment shown that the leadframe line 62 is led up to the strip conductor 58 and is adjacent thereto. By means of application of a conductive spot of adhesive 63, which extends over part of the strip conductor 58 and part of the leadframe line 62, an electric connection can be produced.

FIGS. 7a and 7b illustrate a perspective and cross-sectional illustration through the connection region between one of the leadframe lines 62 and the strip conductor 58 in a further variant. In the embodiment shown, a recess 64 is provided, wherein the strip conductor 58 is located on the surface on which the recess 64 is provided. In particular, the recess 64 can penetrate the strip conductor 58. By introduction of a drop of glue 67, which completely fills the recess 64, the electric connection can be produced. In order to relieve the connection with the conductive adhesive of load thermally, the leadframe line 62 can have a branching or protruding structure 66 through which thermal stresses are reduced.

FIGS. 8a and 8b illustrate a perspective and cross-sectional illustration through the connection region between one of the leadframe lines 62 and the strip conductor 58 in a further variant. It is illustrated in the embodiment shown that one of the leadframe lines 62 projects out of the body of the contacting part 5 and the strip conductor 58 is arranged around the projecting portion of the leadframe line 62. By application of the conductive adhesive onto the projecting portion of the leadframe line 62, an electric connection between the leadframe line 62 and the strip conductor 58 can be produced.

The invention claimed is:

1. A contacting part (5) for a drive module (1), comprising:
   a basic body configured to contact a brush-commutated drive motor (2) via brushes;
   at least one supply line (62) electrically contacting the drive motor (2);
   a circuit surface (57) on which a strip conductor is directly applied by means of an MID (Molded Interconnect Device) technique; and
   at least one component (59) electrically connected to the strip conductor (58).

2. The contacting part (5) as claimed in claim 1, wherein the at least one supply line (62) runs at least in sections in one direction of extent, wherein the circuit surface (57) is arranged transversely with respect to the direction of extent.

3. The contacting part (5) as claimed in claim 1, wherein the at least one supply line (62) runs at least in sections in one direction of extent, wherein the circuit surface (57) is arranged parallel to the direction of extent, and wherein, for contacting the at least one supply line (62), the strip conductor (58) is guided onto an adjacent supply line surface (65) which is arranged transversely with respect to the direction of extent.

4. The contacting part (5) as claimed in claim 2, wherein the component (59) is connected to the strip conductor (58) by a conductive material applied between the contact of the component (59) and the strip conductor (58).

5. The contacting part (5) as claimed in claim 4, wherein a portion of the supply line (62) is accessible via an opening (64) close to one end (61) of the strip conductor (58) to be contacted, or wherein a portion of the supply line (62) penetrates the strip conductor (58) to be contacted, or wherein a portion of the supply line (62) is guided on a surface of the contacting part (5) and the strip conductor (58) is adjacent to the portion of the supply line (62).

6. The contacting part (5) as claimed in claim 1, wherein the at least one supply line (62) runs at least in sections in one direction of extent, and wherein the basic body has an aperture for receiving a rotor shaft of a drive motor (2) and a connection plug (52) receiving electric pins, and the direction of extent of the at least one supply line (62) is connected to the pins.

7. A drive module (1) comprising:
   a drive motor (2); and
   a contacting part (5) as defined in claim 1, which is connected to the drive motor (2) in order to provide contacting of the drive motor (2) via the supply lines (62).

8. The drive module (1) as claimed in claim 7, wherein the drive module (1) is inserted into a housing (21) of the drive motor (2).

9. The drive module (1) as claimed in claim 7, wherein a transmission case (3) is arranged on a side of the contacting part (5) that is situated opposite the drive motor (2), and wherein a circuit surface (57) projects into the transmission case (3).

10. A method for producing the contacting part (5) for the drive module (1) defined in claim 1, comprising the following steps:
   providing the non-conductive basic body with the at least one at least partially embedded supply line (62) for providing contacting of the brush-commutated drive motor (2);
   applying the strip conductor (58) directly onto the circuit surface (57) of the basic body by means of an MID technique; and
   electrically contacting at least one electric component (59) via the strip conductor (58).

11. The method as claimed in claim 10, wherein the electric component (59) is electrically contacted by means of a curing conductive material or with a soldered joint.

12. The method as claimed in claim 11, wherein an electric connection between the at least one supply line (62) and the strip conductor (58) is undertaken by applying the curing conductive material.

13. The method as claimed in claim 12, wherein the strip conductor (58) is applied to the circuit surface (57) by one of the following methods for the MID technique:
   printing with a film made from a conductive material using a hot embossing die which depicts the structures of the strip conductor (58) as embossed surfaces such that that region of the film which is acted upon by the hot embossing die fuses with the material of the basic body and remains adhering to the basic body when the film is peeled off, while the remaining region of the film is detached from the circuit surface (57);
   spraying the circuit surface (57) through a patterning mask with conductive metal particles which are formed so as to adhere such that the structure of the strip conductor (58) is formed on the circuit surface in a manner corresponding to the patterning mask; and
   inscribing the circuit surface (57) with the aid of laser direct patterning in accordance with the structure of the strip conductor (58) such that the material of the basic body is activated in the region of the strip conductor (58) to be applied, wherein the strip conductor (58) is produced by electrodeposition metallization of the activated region.

14. The contacting part (5) as claimed in claim 1 wherein the contacting part is a brush holder component, wherein the at least one supply line (62) is a leadframe line, and wherein the at least one component (59) is an SMD Surface Mount Device) component (59).

15. The contacting part (5) as claimed in claim 2, wherein the strip conductor (58) is connected to the at least one supply line (62) by a conductive material applied between the at least one supply line (62) and the strip conductor (58).

16. The contacting part (5) as claimed in claim 1, wherein the at least one supply line (62) runs at least in sections in one direction of extent, and wherein the basic body has an aperture for receiving a rotor shaft of a drive motor (2) and a connection plug (52) receiving electric pins, and the direction of extent runs in the radial direction with respect to the rotor shaft.

17. A method for producing the contacting part (5) for the drive module (1) defined in claim 1, comprising the following steps:
   providing the non-conductive basic body made from a plastics material, with the at least one at least partially embedded supply line (62) for providing contacting of the brush-commutated drive motor (2);
   applying the strip conductor (58) directly onto the circuit surface (57) of the basic body by means of an MID technique; and
   electrically contacting at least one SMD component (59) via the strip conductor (58).

18. The method as claimed in claim 17, wherein the electric component (59) is electrically contacted by means of a conductive adhesive or with a soldered joint.

19. The method as claimed in claim 18, wherein an electric connection between the at least one supply line (62) and the strip conductor (58) is undertaken by applying the curing conductive material.

20. The method as claimed in claim 19, wherein the strip conductor (58) is applied to the circuit surface (57) by one of the following methods for the MID technique:
   printing with a film made from a conductive material using a hot embossing die which depicts the structures of the strip conductor (58) as embossed surfaces such that that region of the film which is acted upon by the hot embossing die fuses with the material of the basic body and remains adhering to the basic body when the film is peeled off, while the remaining region of the film is detached from the circuit surface (57);
   spraying the circuit surface (57) through a patterning mask with conductive metal particles which are formed so as to adhere such that the structure of the strip conductor (58) is formed on the circuit surface in a manner corresponding to the patterning mask; and
   inscribing the circuit surface (57) with the aid of laser direct patterning in accordance with the structure of the strip conductor (58) such that the material of the basic body is activated in the region of the strip conductor (58) to be applied, wherein the strip conductor (58) is produced by electrodeposition metallization of the activated region.

* * * * *